United States Patent
Kwak et al.

(10) Patent No.: US 7,160,038 B2
(45) Date of Patent: Jan. 9, 2007

(54) VERTICAL CAVITY SURFACE EMITTING LASER MODULE

(75) Inventors: Kyu-Sub Kwak, Seoul (KR);
Young-Min Lee, Yongin-si (KR);
June-Hyeon Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 106 days.

(21) Appl. No.: 10/922,440

(22) Filed: Aug. 19, 2004

(65) Prior Publication Data

US 2005/0147360 A1 Jul. 7, 2005

(30) Foreign Application Priority Data

Jan. 2, 2004 (KR) .................. 10-2004-0000113

(51) Int. Cl.
*G02B 6/36* (2006.01)
*H01S 5/00* (2006.01)

(52) U.S. Cl. .................. 385/93; 385/92; 385/14; 372/92; 372/101; 372/98; 372/43.01; 372/50.124; 372/50.21; 372/50.23

(58) Field of Classification Search .............. 385/14, 385/92, 93, 88, 129, 130, 131; 372/92, 97, 372/98, 75, 50.1, 43.01, 50.124, 50.21, 50.23
See application file for complete search history.

(56) References Cited

U.S. PATENT DOCUMENTS

| 6,368,890 | B1* | 4/2002 | Wickstrom et al. | 438/29 |
| 6,670,599 | B1* | 12/2003 | Wagner et al. | 250/214.1 |
| 2003/0002826 | A1* | 1/2003 | Cohen et al. | 385/94 |
| 2004/0264537 | A1* | 12/2004 | Jackson | 372/50 |

* cited by examiner

*Primary Examiner*—Brian M. Healy
(74) *Attorney, Agent, or Firm*—Cha & Reiter, LLC

(57) ABSTRACT

A vertical cavity surface emitting laser (VCSEL) module includes a substrate provided with an etched region formed on a lower surface thereof, a plurality of layers, for photo-production, laminated on an upper surface of the substrate, and a VCSEL for emitting the light upwards and downwards, wherein the VCSEL module monitors the output of the VCSEL by detecting the light emitted downwards from the VCSEL.

21 Claims, 6 Drawing Sheets

VERTICAL CAVITY SURFACE EMITTING LASER MODULE

CLAIM OF PRIORITY

This application claims priority to an application entitled "VERTICAL CAVITY SURFACE EMITTING LASER MODULE," filed in the Korean Intellectual Property Office on Jan. 2, 2004 and assigned Ser. No. 2004-113, the contents of which are hereby incorporated by reference.

BACKGROUND OF THE INVENTION

1. Field of the Invention

The present invention relates to a laser module, and more particularly to a vertical cavity surface emitting laser (VCSEL) module used in optical communication fields.

2. Description of the Related Art

The development of a low-price optical module is a leading factor in a rapid growth in the development of FTTH (Fiber to the Home) network. In this spirit, a bidirectional optical module using a vertical cavity surface emitting laser (VCSEL) has been vigorously developed; however, it is not easy to form an optical module used to measure the optical output of a VCSEL at a low cost. Moreover, as the optical output direction of the VCSEL is perpendicular to the surface of VCSEL, it is difficult to reflect light emitted perpendicularly from the VCSEL and to induce the reflected light again toward a silicon optical bench (hereinafter, referred to as a "SiOB"), on which the VCSEL is mounted. Furthermore, in case that a plurality of devices including the VCSEL is integrated as a unit, it is difficult to control the reflection of light toward an undesired region.

Meanwhile, a Si-base PD is typically used as a monitor photodiode (MPD) for measuring the optical output of the VCSEL. Since, in a unidirectional (or transmitting or receiving) optical module, a VCSEL serving as a light emitting device and a PIN-PD (positive-intrinsic-negative PD) serving as a light receiving device are independently integrated, it is comparatively easy to integrate an MPD with the VCSEL. As such, the employment of a TO-can package proposes various alternatives for solving the above integration problem.

FIG. 1 is a schematic view of a conventional VCSEL module having a TO-can package structure. As shown, the conventional VCSEL module 100 comprises a substrate 110, a plurality of pins 112, an optical bench 120, a VCSEL 130, a housing 140, a lens 150, and an optical fiber 160.

A plurality of the pins 112 is used to apply the voltage to the substrate 110 and the optical bench 120 mounted on the pins 112. The VCSEL 130 is mounted at a central area of the upper surface of the optical bench 120, and MPD regions (not shown) for optical detection are formed at a peripheral area on the upper surface of the optical bench 120. A lower end of the housing 140 is attached to the substrate 110, and a hole having a circular shape is formed at an upper surface of the housing 140. The lens 150 is installed at the hole and serves to converge the light emitted upwards from the VCSEL 130 and to partially reflect the converged light downwards.

The optical fiber 160 includes a core 162 and a clad layer 164 surrounding the core 162, and is disposed above the housing 140 so that the optical fiber 160 is aligned with the lens 150. The light converged by the lens 150 is incident on the core 162 of the optical fiber 160, and the light reflected by the lens 150 is incident on the MPD regions of the optical bench 120. The MPD regions detect the light incident thereon as an electrical signal and monitor an output state of the VCSEL 130 from the above electrical signal.

When a bidirectional) module is manufactured, the VCSEL and the PIN-PD must be integrated into a single package. In this case, it is required to prevent the light emitted from the VCSEL from being reflected toward the PIN-PD. Therefore, monitoring of the output of the VCSEL using the reflected light is restricted. Also, in most of the bidirectional modules using a PLC (Planar Lightwave Circuit), since a gap between the VCSEL and the PIN-PD is excessively narrow, it is difficult to employ a method for detecting the reflected light. Moreover, in case that a plurality of devices are integrated into an array type, such as a parallel link, it is difficult to prevent light emitted from one device from being incident on the adjacent devices.

As described above, since the conventional VCSEL module monitors the output state of the VCSEL using reflected light, it is difficult to apply the conventional VCSEL to bidirectional optical modules.

SUMMARY OF THE INVENTION

Therefore, the present invention has been made in view of the above problems and provides additional advantages, by providing a VCSEL module for detecting the light emitted from a VCSEL without using reflected light.

In one embodiment, a vertical cavity surface emitting laser (VCSEL) module includes: a substrate provided with an etched region formed on a lower surface thereof; a plurality of layers, for photoproduction, laminated on an upper surface of the substrate; and a VCSEL for emitting produced light upwards and downwards, wherein the VCSEL module monitors an output state of the VCSEL by detecting the light emitted downwards from the VCSEL.

BRIEF DESCRIPTION OF THE DRAWINGS

The above features and other advantages of the present invention will be more clearly understood from the following detailed description taken in conjunction with the accompanying drawings, in which.

DETAILED DESCRIPTION

Now, an embodiment of the present invention will be described in detail with reference to the annexed drawings. For the purposes of clarity and simplicity, a detailed description of known functions and configurations incorporated herein will be omitted as it may make the subject matter of the present invention unclear.

Figure 1:
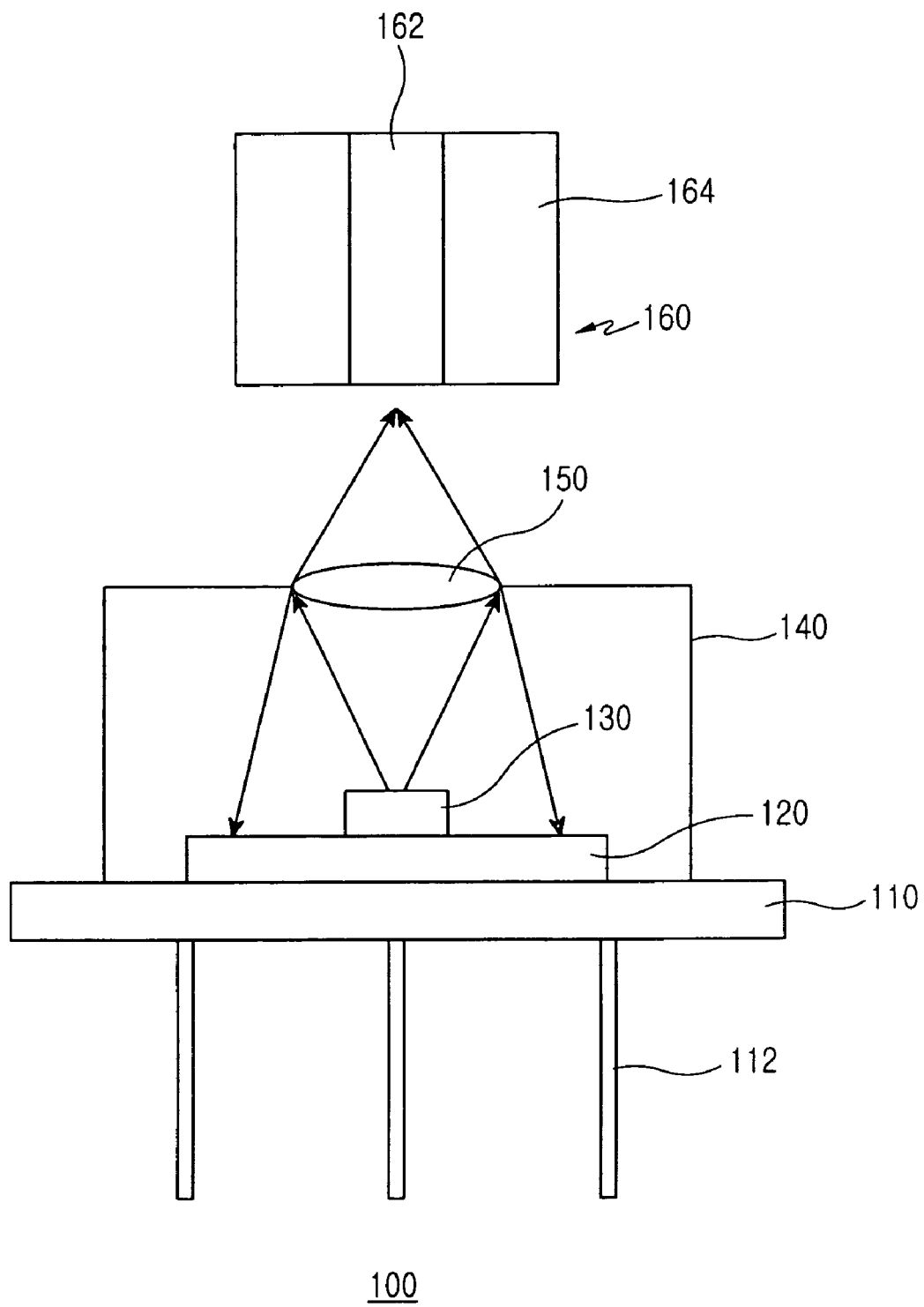
FIG. 1 is a schematic view of a conventional VCSEL module having a TO-can package structure.
Figure 2:
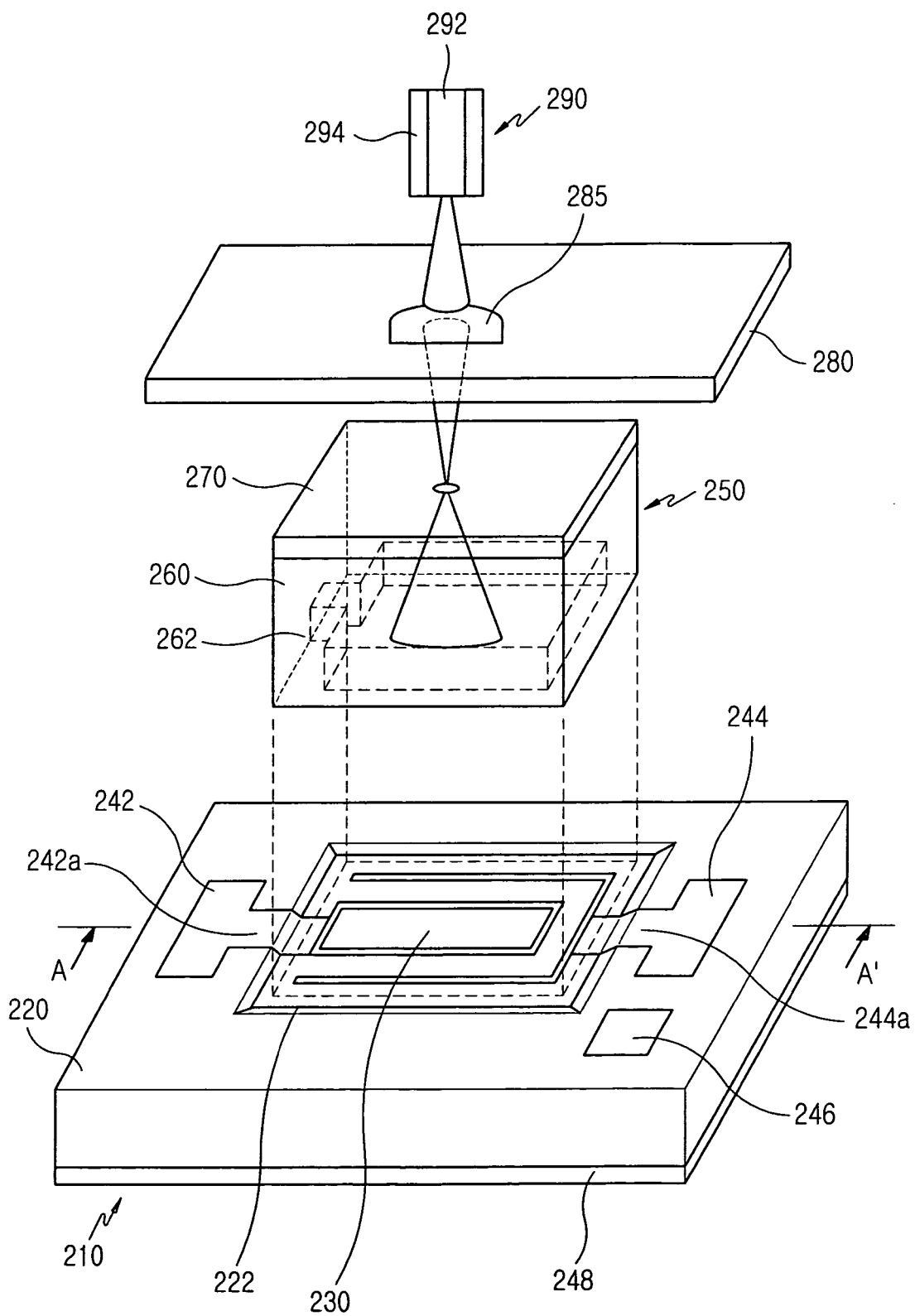
FIG. 2 is a perspective view of a VCSEL module in accordance with a preferred embodiment of the present invention.

Referring to FIG. 2, the VCSEL module 200 in accordance with an embodiment of the present invention includes a SiOB 210, a VCSEL 250, a plastic molded package 280 provided with a lens 285, and an optical fiber 290.

Figure 4:
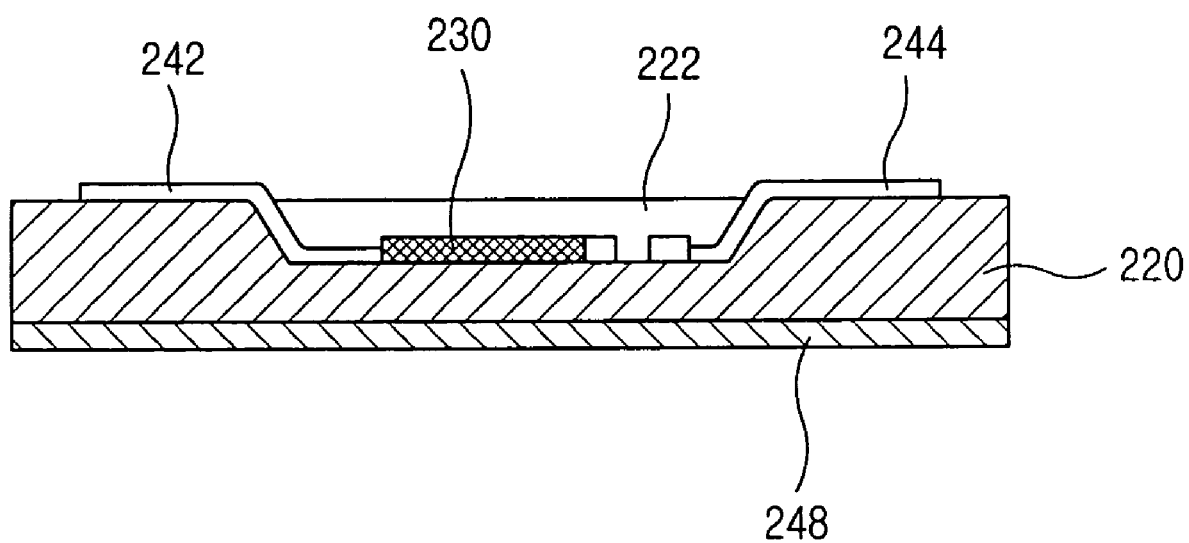
FIG. 4 is a sectional view of a SiOB shown in FIG. 2, taken along the line A—A.

With reference to FIGS. 2 and 4, a V-shaped groove 222 is formed on an upper surface of the SiOB 210, and an MPD region 230 is formed on the bottom of the V-shaped groove 222. The MPD region 230 detects light emitted from the VCSEL 250 downwards and formed by a conventional diffusion process. An MPD anode pad 242 for operating the MPD region 230 is disposed at one side of the V-shaped groove 222, and is electrically connected to the MPD region 230 by a first metal pattern 242a. A VCSEL cathode pad 244 for operating the VCSEL 250 is disposed at the other side of the V-shaped groove 222, and is electrically connected to the VCSEL 250 by a second metal pattern 244a disposed along the circumference of the MPD region 230. Further, a VCSEL anode pad 246 for operating the VCSEL 250 is disposed at one side of the VCSEL cathode pad 244. The MPD anode pad 242, VCSEL cathode 244, and anode pads 246 are disposed on the SiOB 210 such that the MPD anode pad 242, VCSEL cathode 244, and anode pads 246 are disposed at the circumference of the V-shaped groove 222. An MPD cathode pad 248 for operating the MPD region 230 is disposed at the lower surface of the SiOB 210.

Figure 3A:
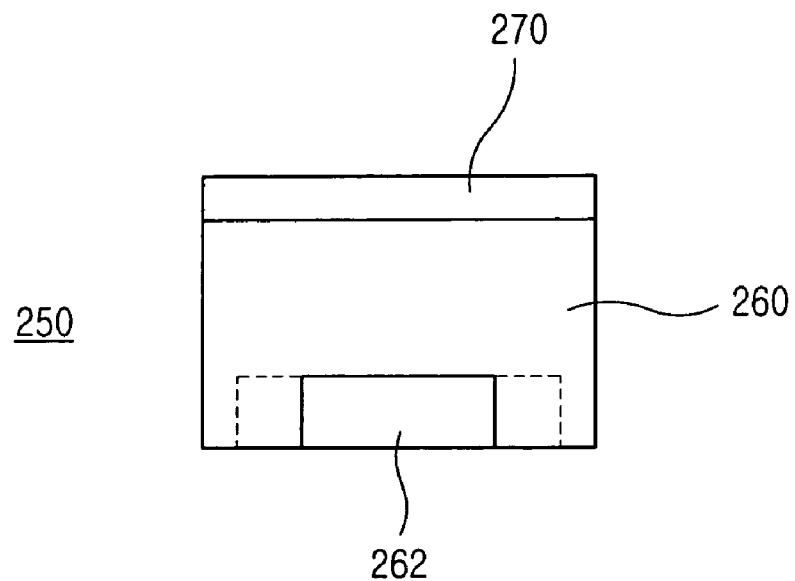
FIG. 3a is a left side view of the VCSEL module shown in FIG. 2.
Figure 3B:
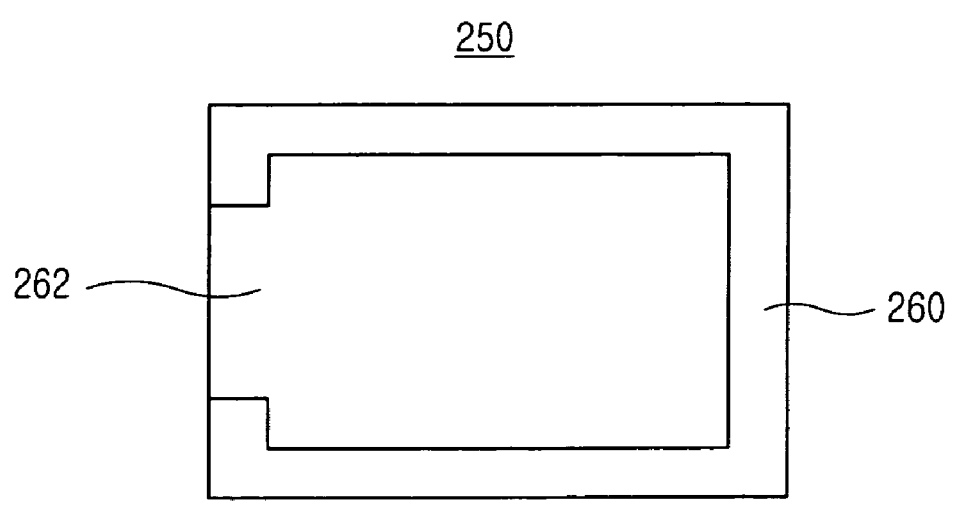
FIG. 3b is a bottom view of the VCSEL module shown in FIG. 2.

With reference to FIG. 2 and FIGS. 3a and 3b, the VCSEL 250 includes a substrate 260 provided with an etched region 262 formed on a lower surface thereof, and a plurality of layers 270, which includes laminated on the upper surface of the substrate 260 and provided with an active region for photoproduction. The plurality of layers(270) comprise an active region, a p-DBR(distributed Bragg reflector) and an n-DBR. The active region consists of AlGaAs/GaAs quantum wells, and each of the DBRs consists of AlGaAs/AlAs layers. The etched region 262 has a box shape provided with an opened lower end surface, and it includes a side surface partially opened towards the MPD anode pad 242. This opening prevents the non-etched lower surface of the VCSEL 250 from contacting the first metal pattern 242a. Note that the etched region 262 may have various shapes, if necessary. The etched region 262 minimizes the absorption of light, emitted downwards from the VCSEL 250, onto the substrate 260, thereby maximizing the power of light incident on the MPD region 230.

Figure 5:
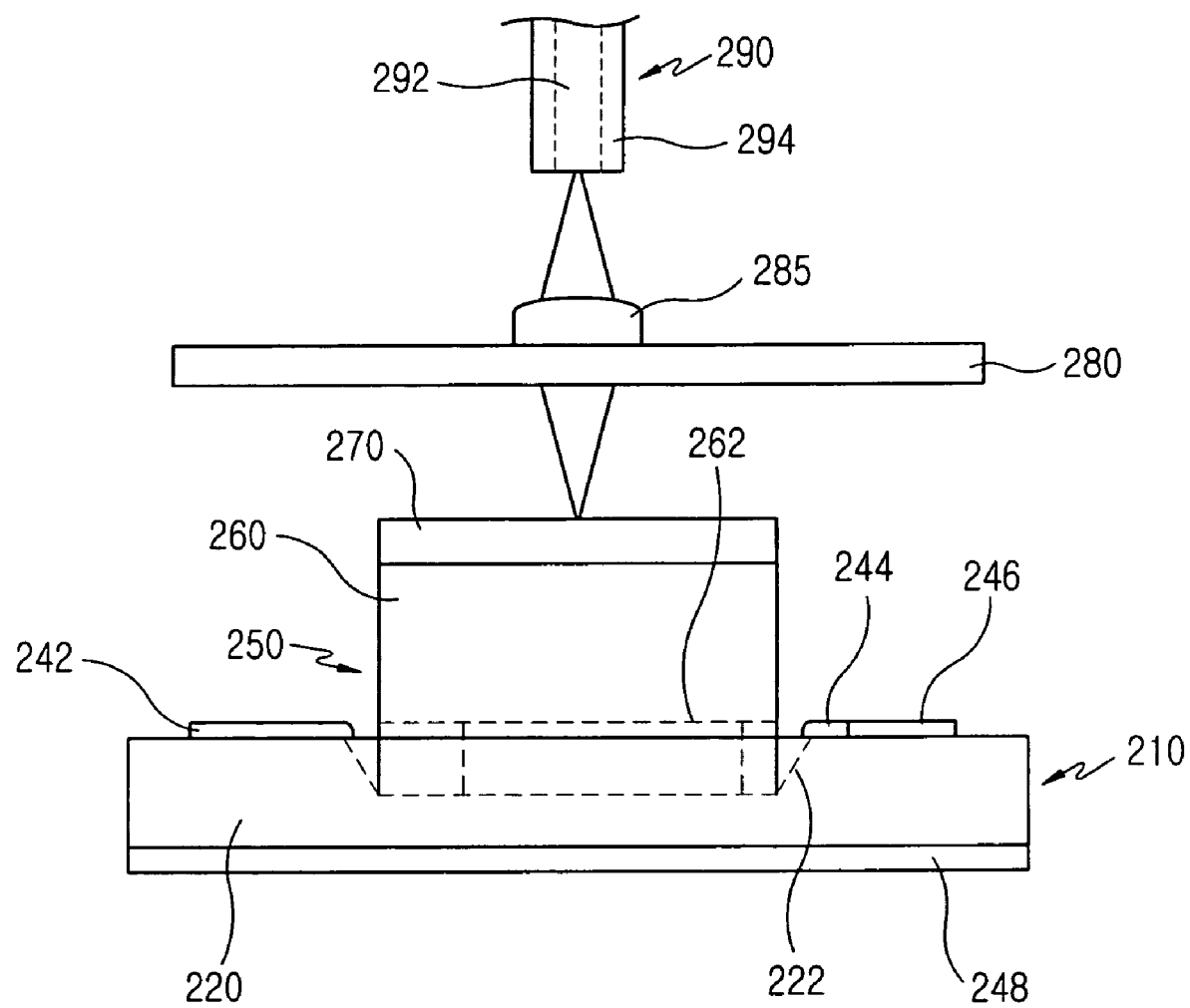
FIG. 5 is a front view of the VCSEL module in accordance with an embodiment of the present invention.

Hereinafter, the mounted state of the SiOB 210 onto the VCSEL 250 will be described with reference to FIG. 5. The VCSEL 250 is mounted on the bottom of the V-shaped groove 222. Here, the MPD region 230 is covered with the etched region 262. The non-etched lower surface of the VCSEL 250 contacts the second metal pattern 244a extended from the VCSEL cathode pad 244, thereby being electrically connected to the VCSEL cathode pad 244. Further, the first metal pattern 242a passes through the partially opened side surface of the VCSEL 250 without causing an electrical contact thereto while electrically connected to the MPD region 230.

The plastic molded package 280 includes the lens 285 at a central area thereof which has an overall plate shape. The lens 285 may be integrated with the plastic molded package 280. The lens 285 converges light emitted upwards from the VCSEL 250.

The optical fiber 290 is coaxially arranged with the lens 285, and includes a core 292 serving as an optical transfer medium and a clad layer 294 surrounding the core 292. Light converged by the lens 285 is incident on the core 292 of the optical fiber 290, and then travels along a longitudinal direction of the optical fiber 290.

Meanwhile, light emitted downwards from the VCSEL 250 is incident on the MPD region 230, and the MPD region 230 detects the incident light as an electrical signal, thereby monitoring the output state of the VCSEL 250. The VCSEL 250 is mounted on the bottom of the V-shaped groove 222, thus decreasing the height of the exposed part of the VCSEL 250 and simplifying the manufacturing process of the VCSEL module 200.

Figure 6:
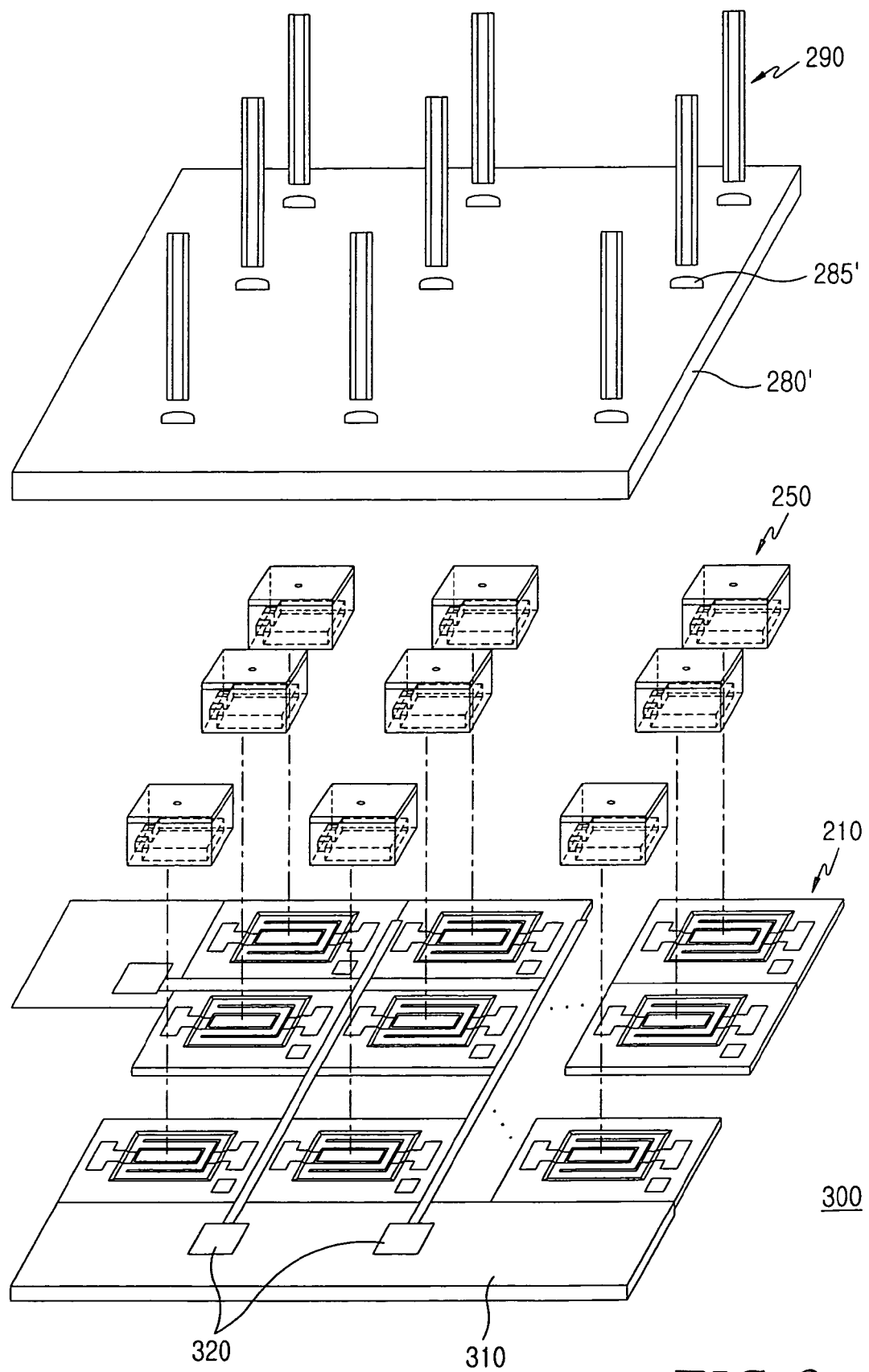
FIG. 6 is an exploded perspective view of a structure in which a plurality of the VCSEL modules of FIG. 2 are arranged in a matrix type and a parallel link is applied thereto.

FIG. 6 is an exploded perspective view of the structure in which a plurality the VCSEL modules of FIG. 2 are arranged in a matrix type, and a parallel link is applied thereto. The structure 300 shown in FIG. 6 comprises a plurality of the VCSEL modules 200 shown in FIG. 2. Some parts of the structure 300 are substantially the same as those in the VCSEL module 200, and are thus denoted by the same reference numerals even though they are depicted in different drawings.

As shown in FIG. 6, a plurality of the SiOBs 210 are arranged in a matrix type, and the VCSELs 250 are mounted on the corresponding SiOBs 210. The VCSELs 250 are covered with a plastic molded package 280' provided with a plurality of lenses 285' and a plurality of optical fibers 290 corresponding to the lenses 285' in a one-to one ratio. In order to obtain the parallel link, at least one subsidiary substrate 310 is disposed in parallel with the SiOBs 210, and a plurality of addressable pads 320 electrically connected to the SiOBs 210 are disposed on the upper surface of the subsidiary substrate 310.

As apparent from the above description, the present invention provides a vertical cavity surface emitting laser (VCSEL) module, in which a lower end surface of a VCSEL is etched and light emitted downwards from the VCSEL is directly detected, thereby monitoring the output state of the VCSEL without using reflected light.

Although only a preferred embodiment of the present invention has been described in detail, those skilled in the art will appreciate that various modifications, additions, and substitutions to the specific elements are possible, without departing from the scope and spirit of the invention as disclosed in the accompanying claims.

What is claimed is:

1. An optical module comprising:
a vertical cavity surface emitting laser (VCSEL) for emitting light comprising:
a substrate provided with an etched region laterally surrounded by a non-etched region of the substrate, the non-etched region disposed along an outer boundary of a lower surface of the substrate;
a plurality of layers, for photoproduction, laminated on an upper surface of the substrate; and
wherein the optical module monitors an output state of the VCSEL by detecting the light emitted downwardly from the VCSEL.

2. The optical module as set forth in claim 1, further comprising an optical bench including a monitor photodiode (MPD) region formed on an upper surface of the optical bench for detecting the light emitted through a lower surface of the VCSEL and allowing the VCSEL to be mounted on the upper surface of the optical bench under a condition that the MPD region and the etched region are arranged with each other.

3. The optical module as set forth in claim 2, wherein a V-shaped groove is formed on the upper surface of the optical bench, and the MPD region is formed on bottom of the V-shaped groove.

4. The optical module as set forth in claim 3, wherein the MPD region is electrically coupled to a MPD anode pad disposed at one end of the V-shaped groove, via a first metal pattern, for operating the MPD region.

5. The optical module as set forth in claim 4, wherein the etched region comprises an opened lower end surface for preventing the non-etched region of the substrate from contacting the first metal pattern.

6. The optical module as set forth in claim 3, wherein in the MPD region is electrically coupled to a VCSEL cathode pad disposed at the other end of the V-shaped groove, via a second metal pattern, for operating the VCSEL.

7. The optical module as set forth in claim 1, further comprising a plastic molded package provided with a lens for converging light emitted upwardly from central area of the VCSEL.

8. The optical module as set forth in claim 7, further comprising an optical fiber coaxially arranged with the lens for transferring light incident thereon by the lens.

9. An optical module comprising:
a vertical cavity surface emitting laser (VCSEL) configured to emit light including:
a substrate containing an etched region formed on a lower surface of the substrate;
a plurality of photoproduction layers disposed on an upper surface of the substrate;
an optical bench containing a groove on an upper surface of the optical bench; and
a monitor photodiode (MPD) region formed on bottom of the groove.

10. The optical module as set forth in claim 9, further comprising:
an MPD anode pad disposed on one end of the groove and electrically coupled to the MPD region via first metal pattern.

11. The optical module as set forth in claim 10, wherein the etched portion of the substrate further comprises an opened lower end surface configured to prevent a non-etched portion of the substrate from contacting the first metal pattern.

12. The optical module as set forth in claim 10, further comprising:
a VCSEL cathode pad disposed on the other end of the groove and electrically coupled to the MPD region via a second metal pattern.

13. The optical module as set forth in claim 9, further comprising a plastic molded package provided with a lens configured to converge light emitted in upward direction from central area of the VCSEL.

14. The optical module as set forth in claim 9, further comprising an optical fiber coaxially arranged with the lens for transferring light incident thereon by the lens.

15. The optical module as set forth in claim 9, wherein the groove is V-shaped.

16. An optical module comprising:
a vertical cavity surface emitting laser (VCSEL) configured to emit light in a first and second directions, the VCSEL comprising:
a substrate having an etched region and a non-etched region, the non-etched region disposed on a periphery of a lower surface of the substrate and laterally surrounding the etched region;
a plurality of photoproduction layers disposed on an upper surface of the substrate;
a monitor photodiode (MPD) inserted into the etched region, surrounded laterally by the non-etched region of the substrate, and configured to receive light emitted from the VCSEL, in the first direction; and
an optical fiber configured to receive light emitted from the VCSEL, in the second direction.

17. The optical module as set forth in claim 16, further comprising
an optical bench including a V-shaped groove.

18. The optical module as set forth in claim 17, further comprising
a MPD anode pad disposed on a first end of the optical bench and electrically coupled to the MPD via a first metal pattern.

19. The optical module as set forth in claim 18, wherein the substrate further comprises an opened end the lower surface, the opened end configured to prevent the non-etched region from contacting the first metal pattern.

20. The optical module as set forth in claim 19, further comprising
a VCSEL cathode pad electrically disposed on a second end of the optical bench and electrically coupled to the MPD via a second metal pattern.

21. The optical module as set forth in claim 20, further comprising
a plastic molded package; and
a lens disposed on the plastic molded package and configured to converge the light emitted from the VCSEL, in the second direction.

* * * * *